United States Patent
Rinder et al.

(10) Patent No.: US 11,719,721 B2
(45) Date of Patent: Aug. 8, 2023

(54) TEST AND MEASUREMENT PROBE HAVING A TOUCHSCREEN

(71) Applicant: Tektronix, Inc., Beaverton, OR (US)

(72) Inventors: Karl A. Rinder, Sparks, NV (US); David A. Sailor, Boring, OR (US); Josiah A. Bartlett, Forest Grove, OR (US)

(73) Assignee: Tektronix, Inc., Beaverton, OR (US)

(*) Notice: Subject to any disclaimer, the term of this patent is extended or adjusted under 35 U.S.C. 154(b) by 195 days.

(21) Appl. No.: 17/251,179

(22) PCT Filed: Jun. 11, 2019

(86) PCT No.: PCT/US2019/036596
§ 371 (c)(1),
(2) Date: Dec. 10, 2020

(87) PCT Pub. No.: WO2019/241280
PCT Pub. Date: Dec. 19, 2019

(65) Prior Publication Data
US 2021/0263074 A1    Aug. 26, 2021

Related U.S. Application Data

(60) Provisional application No. 62/683,611, filed on Jun. 11, 2018.

(51) Int. Cl.
*G01R 1/067* (2006.01)
*G01R 1/02* (2006.01)
(Continued)

(52) U.S. Cl.
CPC ......... *G01R 1/06788* (2013.01); *G01R 1/025* (2013.01); *G01R 1/04* (2013.01); *G01R 31/3025* (2013.01)

(58) Field of Classification Search
CPC ...... G01R 1/06788; G01R 1/025; G01R 1/04; G01R 31/3025; G01R 1/06766; G01R 13/02; G01R 15/125; G01R 31/2844
(Continued)

(56) References Cited

U.S. PATENT DOCUMENTS 8,004,273 B1 * 8/2011 McKinley ............... G01R 13/28
324/121 R
11,280,827 B2 * 3/2022 Thompson ......... G01R 31/2875
(Continued)

FOREIGN PATENT DOCUMENTS

| EP | 1359425 | 11/2003 |
|---|---|---|
| EP | 2827155 | 1/2015 |

(Continued)

OTHER PUBLICATIONS

European Patent Office as International Searching Authority, International Search Report and Written Opinion for International Application No. PCT/US2019/036596, dated Oct. 9, 2019, 17 pages, European Patent Office, Rijswijk, NL.

*Primary Examiner* — Giovanni Astacio-Oquendo
(74) *Attorney, Agent, or Firm* — Miller Nash LLP; Andrew J. Harrington

(57) ABSTRACT

A test-and-measurement probe (200) for a test-and-measurement instrument (101), the test-and-measurement probe having a probe head (103) and a touchscreen user interface (250). The probe head is configured to obtain a signal from a device under test. The touchscreen user interface is configured to visually convey test-and-measurement information to a user and to accept user touch input. In embodiments, the touchscreen user interface is removably connected to a compbox (105) of the test-and-measurement probe, through a wired connection or wirelessly.

20 Claims, 6 Drawing Sheets

(51) Int. Cl.
  *G01R 1/04* (2006.01)
  *G01R 31/302* (2006.01)
(58) Field of Classification Search
  USPC .............................. 324/754.03, 755.01, 537
  See application file for complete search history.

(56) References Cited

U.S. PATENT DOCUMENTS

| | | | |
|---|---|---|---|
| 11,360,140 B1* | 6/2022 | Kimes | G01R 31/2817 |
| 11,378,619 B2* | 7/2022 | Sameshima | G01R 1/44 |
| 2003/0137310 A1* | 7/2003 | Holzel | G01R 13/00 |
| | | | 324/537 |
| 2003/0236469 A1* | 12/2003 | Hedgecock | A61B 5/05 |
| | | | 600/554 |
| 2004/0160410 A1 | 8/2004 | Plathe | |
| 2010/0073018 A1* | 3/2010 | Ruppelt | G01R 1/06705 |
| | | | 324/755.01 |
| 2011/0193548 A1* | 8/2011 | Ko | G01R 19/2503 |
| | | | 324/114 |
| 2015/0160309 A1* | 6/2015 | Chou | G01R 33/10 |
| | | | 324/262 |
| 2015/0168482 A1* | 6/2015 | Flynn | G01R 31/2889 |
| | | | 324/754.07 |
| 2016/0076936 A1 | 3/2016 | Stuart | |
| 2016/0076937 A1 | 3/2016 | Stuart | |
| 2016/0080666 A1 | 3/2016 | Stuart | |
| 2016/0128599 A1* | 5/2016 | Rea | A61B 5/6877 |
| | | | 600/546 |
| 2016/0231354 A1* | 8/2016 | Rayman | G01R 31/2896 |
| 2020/0100691 A1* | 4/2020 | Shi | A61B 5/6885 |

FOREIGN PATENT DOCUMENTS

| | | |
|---|---|---|
| EP | 3144688 | 3/2017 |
| JP | 2014010124 | 1/2014 |
| KR | 101770384 | 9/2017 |
| WO | 2010108089 | 9/2010 |
| WO | 2012096240 | 7/2012 |
| WO | 2018/062597 | 4/2018 |

* cited by examiner

TEST AND MEASUREMENT PROBE HAVING A TOUCHSCREEN

CROSS-REFERENCES TO RELATED APPLICATIONS

This patent application claims the benefit of U.S. Provisional Application No. 62/683,611 filed Jun. 11, 2018. That application is incorporated into the present application by this reference.

TECHNICAL FIELD

This disclosure relates to test-and-measurement instruments and, more particularly, to test-and-measurement probes.

BACKGROUND

Users of test-and-measurement instruments, such as oscilloscopes, often use probes to connect a device under test (DUT), such as a circuit board, to an input of the test-and-measurement instrument in order to visualize and perform measurements of signals occurring in the DUT. Test-and-measurement companies, such as Tektronix, Inc., typically offer many different types of probes designed for a wide variety of probing applications. The design of a probe may take into account the type of signal to be measured. For example, some probes may be designed to measure voltage signals, while others are designed to measure current signals, and still others may be designed to measure optical signals. The design of a probe may also take into account the physical geometry of the test point to be probed on the DUT. For example, some probes may be so-called "solder-down" or "solder-in" probes, which are designed to be soldered into place on a user's DUT, while others are so-called "browser" style probes, which are designed to be held by a user and physically placed in contact with a test point on the DUT. A probe's design may also take into account the type of test-and-measurement instrument to which the probe is connected, or the particular type of input connector on the test-and-measurement instrument. For example, some test-and-measurement instruments may feature a simple BNC (Bayonet Neill-Concelman) input connector, while others may use a specialty probe-to-instrument connection interface such as the TEKCONNECT® probe interface, or the TEKVPI® probe interface, both provided by Tektronix, Inc. A probe's design may take into account a combination of these and other design factors, and may make design tradeoffs between them. As a result, the portfolio of probes offered by a test-and-measurement company may include dozens or even hundreds of different probe models.

Embodiments of the disclosed technology address shortcomings in the prior art.

DETAILED DESCRIPTION

As described herein, embodiments are directed to a test-and-measurement probe having a touchscreen user interface that is available within the user's workspace. Thus, embodiments of the disclosed technology may enhance a user's probing experience by keeping the user's focus on the DUT; providing a way to control the test-and-measurement probe at the DUT; providing a way to control the test-and-measurement instrument at the DUT; providing a visual display of a measurement, status, or waveform at the DUT; providing a magnification view of the DUT for probing; and other potential benefits described below.

Figure 1:
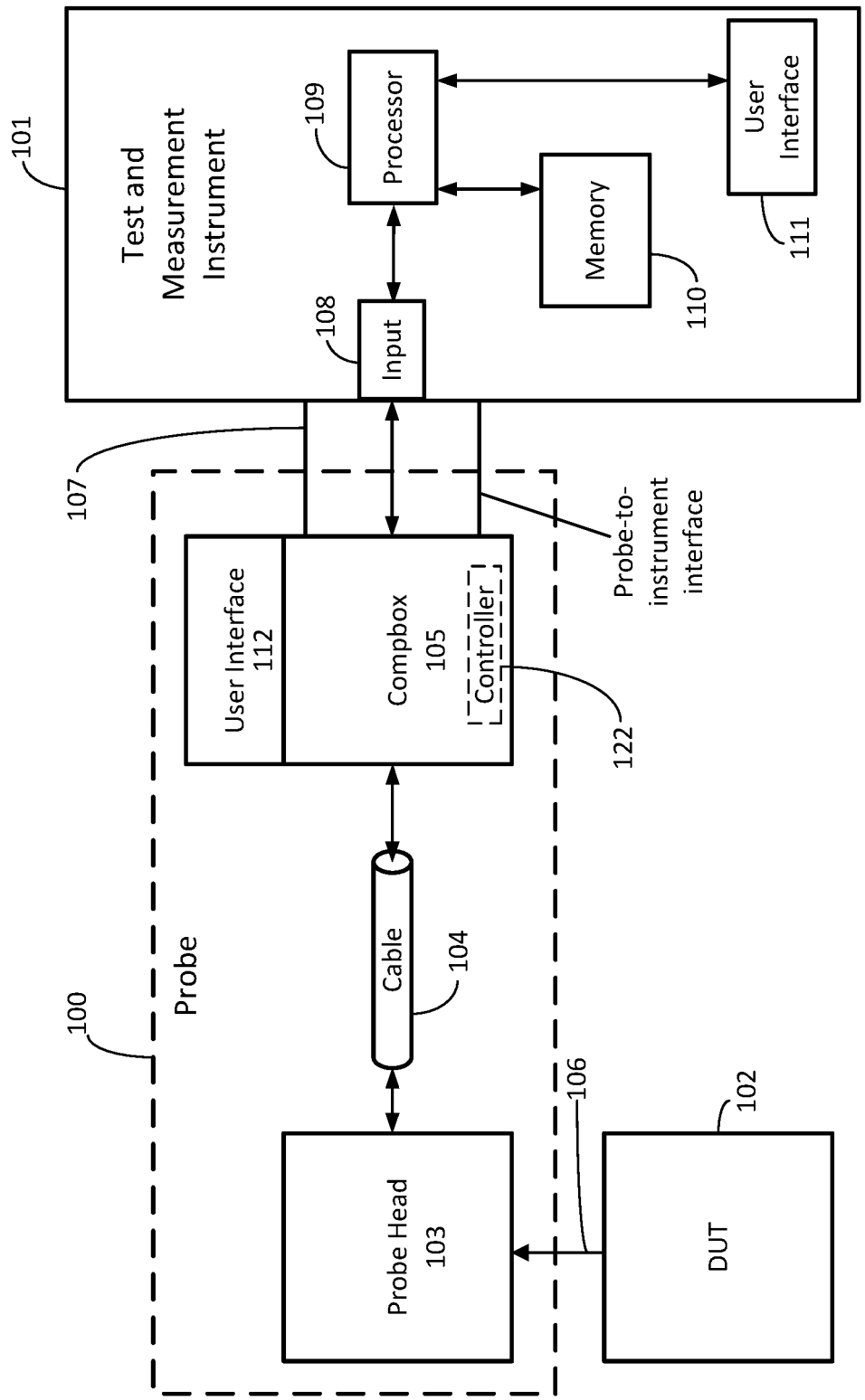
FIG. 1 is a functional block diagram of a configuration for a test-and-measurement probe connected to a test-and-measurement instrument and a device under test.

FIG. 1 is a functional block diagram showing portions of a configuration for a test-and-measurement probe 100 that is connected to a test-and-measurement instrument 101 and a device under test (DUT 102). As illustrated in FIG. 1, a test-and-measurement probe 100 typically includes a probe head 103, a probe cable 104, and a compbox 105.

The probe head 103 is the part of the test-and-measurement probe 100 that physically connects the test-and-measurement probe 100 to the DUT 102 and obtains a signal 106 from the DUT 102. The signal 106 may be, as examples, an electrical signal or an optical signal. The probe head 103 may be a single probe tip contact, or the probe head 103 may be more complex, such as a probe head for an active probe containing an amplifier or other signal conditioning circuitry. The probe cable 104 is typically of some length, generally one meter or more, and conducts the signal 106 acquired from the DUT 102 between the probe head 103 and the compbox 105.

The compbox 105 is the part of the test-and-measurement probe 100 that connects to the test-and-measurement instrument 101, generally through a probe-to-instrument interface 107. The probe-to-instrument interface 107 may include mechanical and electrical connections to mechanically and electrically connect the test-and-measurement probe 100 to the test-and-measurement instrument 101. "Compbox" is a standard term in the test-and-measurement industry and refers to the electronics between the probe cable 104 and the probe-to-instrument interface 107, which are oftentimes in a housing, or box. While the term historically comes from the phrase "compensation box," as used in this disclosure a compbox may or may not include electronics to compensate for any mismatch in impedance of the test-and-measurement probe 100 and an input 108 of the test-and-measurement instrument 101. The compbox 105 typically houses a controller 122 to control operation of various components of the test-and-measurement probe 100. However, the controller 122 may alternatively be located on or in the probe head 103, or anywhere else on the test-and-measurement probe too between the probe-to-instrument interface 107 and the probe head 103.

The test-and-measurement instrument 101 may be, for example, an oscilloscope and may include a processor 109, memory 110, and a user interface 111 that may include a display. The processor 109 may communicate with the controller 122 of the test-and-measurement probe 100 through the probe-to-instrument interface 107.

The compbox 105 may include a user interface 112, typically in the form of buttons or lights, or both, that allow a user to monitor and control settings or functions of the test-and-measurement probe 100 or the test-and-measurement instrument 101. For example, the user interface 112 may have a menu button which, when pressed by a user, brings up menu options on a display of the test-and-measurement instrument 101. In a conventional probe, the user interface 112 of the compbox 105 may be implemented through a combination of status lights, graphical or textual labels, membrane switches, and e-mat switches, which are a type of flexible switch that include a dome switch or other mechanical switch in a flexible substrate, or mat.

Hence, the user interface 112 of the compbox 105 for each different probe type may have a unique combination of status lights, graphical or textual labels, membrane switches, and e-mat switches. Since these are physical components, though, it may be difficult and time-consuming to redesign these components to include functionality beyond what the component was originally designed to perform. Furthermore, even a relatively simple modification, such as a label text or color scheme change, may require a redesign of these components.

Probe settings can often be changed through a user interface 112 of the connected test-and-measurement instrument 101. But the connected test-and-measurement instrument 101 may not have a display, or the display of the test-and-measurement instrument 101 may be out of reach or out of view when the user is operating the test-and-measurement probe 100. Furthermore, one of the challenges of probing is having to make changes to probe settings while trying to obtain a signal from a particular location on the DUT 102. Because humans only have two hands, a user usually has to divert the user's attention—and at least one of the user's hands—to the test-and-measurement instrument 101 to make changes to probe settings. By looking away from the DUT 102, though, the user may accidentally lose physical contact with the desired portion of the DUT 102. Additionally, when the user reaches for the test-and-measurement instrument tot, for example to change a setting, the user is diverted from the probing task at hand.

Figure 2:
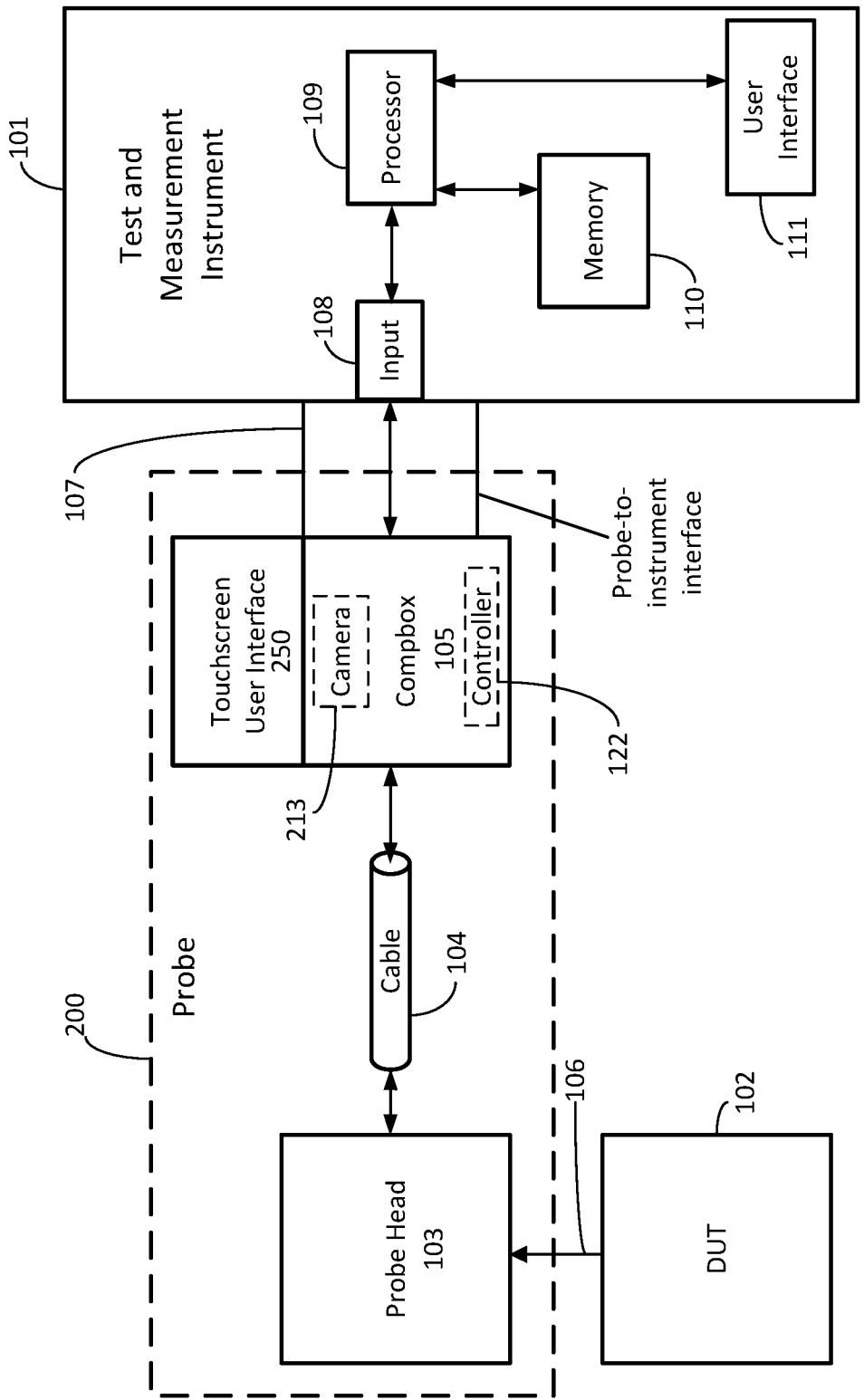
FIG. 2 is a functional block diagram of a configuration for a test-and-measurement probe having a touchscreen user interface, according to embodiments.

FIG. 2 is a functional block diagram showing portions of a configuration for an improved test-and-measurement probe 200 that is connected to a test-and-measurement instrument 101 and a DUT 102. As illustrated in FIG. 2, a test-and-measurement probe 200 may include a probe head 103, a probe cable 104, and a compbox 105. The test-and-measurement probe 200 may be joined to a test-and-measurement instrument 101 by a probe-to-instrument interface 107. The compbox 105, the probe cable 104, the test-and-measurement instrument 101, and the probe-to-instrument interface 107 illustrated in FIG. 2 are each as described above for FIG. 1. The test-and-measurement probe 200 includes a touchscreen user interface 250 instead of the user interface 112 of FIG. 1, and the test-and-measurement probe 200 may also include a probe camera 213.

The touchscreen user interface 250 includes a processor and is configured to visually convey information to a user and to accept user touch input, both through a touchscreen display 418 of the touchscreen user interface 250.

The touchscreen user interface 250 may permit an improved approach for communication between the test-and-measurement probe 200 and the test-and-measurement instrument 101. A single touchscreen user interface 250 design may be configured to work with a number of different test-and-measurement probe designs. Hence, the touchscreen user interface 250 may create a common platform for test-and-measurement probes to use the same user interface design and allow for an icon-driven approach to test-and-measurement probe connectivity with the test-and-measurement instrument 101. With a touchscreen user interface 250, the user could have a test-probe-specific menu series that could be adapted for other types of test-and-measurement probes, while utilizing a common software platform for the different types of test-and-measurement probes.

For example, by selecting a virtual menu button that is displayed on the touchscreen user interface 250, a user can navigate to a submenu to select a desired attenuation without looking at the user interface of the test-and-measurement instrument 101. Moreover, the menu structure as presented on the touchscreen user interface 250 may be customized for different types of test-and-measurement probes (such as, for example, single-ended, differential, power, or high-bandwidth test-and-measurement probes, among others), thus presenting a menu structure that fits the particular test-and-measurement probe's intended use, while using a common software design.

In embodiments, test-and-measurement information may be shown on the touchscreen user interface 250. Non-exclusive examples of such test-and-measurement information are calibration status, connectivity, identification of the test-and-measurement probe that is coupled to the touchscreen user interface 250, status of the test-and-measurement probe, status of the test-and-measurement instrument 101, DUT measurements (such as, current, voltage, and waveforms) and graphical features to prompt the user to make touch inputs, including through virtual buttons and menus.

The coupled test-and-measurement probe may be identified by, for example, displaying on the touchscreen user interface 250 an icon, color, or textual information corresponding to the test-and-measurement probe or the channel of the test-and-measurement instrument 101 to which the test-and-measurement probe is connected. In embodiments, a user input to the touchscreen user interface 250 may cause a light, such as an LED, on the coupled probe head 103 to illuminate, thus visually identifying the corresponding probe head 103 to the user. The light may illuminate in a color that corresponds to the channel of the test-and-measurement instrument 101 to which the test-and-measurement probe is connected.

As another example use of probe identification, some probes types include interchangeable probe tips. Accordingly, the displayed test-and-measurement information may identify the particular probe tip that is in use. In addition, the touchscreen user interface 250 may automatically tailor menu options to those options that are associated with or relevant to the identified probe tip.

Once a particular probe tip is identified, the touchscreen user interface 250 may also display an accessory to be used with the identified probe tip. If the user has a series of tests that require different probe tips and different accessories, the touchscreen user interface 250 may display the next sequence of probe tip and accessory requirements, one after another, thus speeding up the testing process.

Displaying test-and-measurement information at the touchscreen user interface 250 may improve the user's efficiency by, for example, reducing the time it takes the user to set up the test-and-measurement probe. That is, allowing the user perform the initial setup of the test-and-measurement probe at the compbox 105 (as opposed to, for example, at the test-and-measurement instrument tot) may speed up the process, allowing the user to start the probing operations sooner. The touchscreen user interface 250 may be especially helpful at reducing setup times for a test-and-measurement instrument 101 that does not have its own display by facilitating user interaction with the test-and-measurement instrument 101.

Having a touchscreen user interface 250 at the test-and-measurement probe may also speed the introduction of new probe models to the market by reducing or eliminating the need for additional physical parts (such as the status lights, graphical or textual labels, membrane switches, and e-mat switches noted above) to be created for each new test-and-measurement probe. Instead, customization may be achieved by programming the touchscreen user interface 250 to have the desired features. Accordingly, one programmable touchscreen user interface 250 may replace dozens of physical user interfaces 112 (such as those conveying information and receiving inputs through status lights, graphical or textual labels, membrane switches, and e-mat switches), thereby greatly reducing inventory of new parts and spare parts. This also simplifies repairs and upgrades, which may be accomplished through software revisions.

Returning to FIG. 2, the probe camera 213 may allow the test-and-measurement probe 200 to capture live video images of the DUT 102. In some embodiments, a still image may be captured and stored. Those captured images may then be displayed on the touchscreen user interface 250, on a display on the test-and-measurement instrument 101, or both. The displayed image may be a magnification or enlargement of the image captured by the probe camera 213 to allow the user to better see the probing point of the DUT 102. It may be particularly beneficial if the image is displayed on the touchscreen user interface 250 because the user may then refer to the image to properly position the test-and-measurement probe 200 at the probing point of the DUT 102, without having the look at the test-and-measurement instrument 101.

In some embodiments, the image captured by the probe camera 213 may be utilized for an augmented reality feature. That is, the test-and-measurement instrument 101 may have data saved regarding the user's schematic and layout for the particular DUT 102. This data may be processed to identify probing locations for measurements. The image captured by the probe camera 213 may be compared to the processed data to guide the user to the correct probing point. For example, the touchscreen user interface 250 may display a flashing arrow over the image captured by the probe camera 213 to guide the user to move the probe head 103 to the desired probing location.

In embodiments, the touchscreen user interface 250 may be removable from the compbox 105. Thus, for example, the touchscreen user interface 250 may be connected to the compbox 105 by a user-interface cable 316, providing a wired connection between the touchscreen user interface 250 and the compbox 105 when the touchscreen user interface 250 is removed from the compbox 105. As another example, the touchscreen user interface 250 may be wirelessly coupled to the compbox 105. In addition to or instead of being coupled to the compbox 105 (whether by wired connection or wirelessly), the touchscreen user interface 250 may be wirelessly coupled to the probe head 103 or to the test-and-measurement instrument 101, or both. The various wireless connections may utilize, for example, Bluetooth® or another short-range wireless communication protocol. Bluetooth® is a registered trademark of Bluetooth Sig, Inc. Accordingly, each touchscreen user interface 250, probe head 103, and test-and-measurement instrument 101 may be separately identifiable through the wireless communication protocol.

The touchscreen user interface 250 may include a battery for wireless operation. The battery of the touchscreen user interface 250 may be rechargeable by, for example, plugging the touchscreen user interface 250 into the compbox 105, a separate docking station 520 (as discussed below for FIGS. 5A and 5B), or another power source.

In embodiments having a removable touchscreen user interface 250, the wireless coupling may be disabled when the touchscreen user interface 250 is connected to the compbox 105 by a wired connection.

The removable touchscreen user interface 250 has many potential advantages for command and control of the test-and-measurement probe 200 and the test-and-measurement instrument 101. For example, the user may have the touchscreen user interface 250 in the user's hand or on the user's workspace next to the DUT 102. Hence, the removable touchscreen user interface 250 may enable functionality at the probing location in the user's workspace. For example, through the removable touchscreen user interface 250, the user may make user inputs (such as, for example, menu selections) to operate or set operating characteristics of the test-and-measurement probe 200 or the test-and-measurement instrument 101, or both, at the user's workspace without requiring the user to turn, reach, or otherwise divert the user's attention away from the DUT 102 and toward the compbox 105 or the test-and-measurement instrument 101. Hence, as one example, a single user may trigger an oscilloscope (as the test-and-measurement instrument tot) to capture data from the DUT 102 while the user remains at the DUT 102 with the test-and-measurement probe 200, even if the probe cable 104 is lengthy (such as, for example, two meters long).

In embodiments, removable touchscreen user interface 250 may be coupled to more than one test-and-measurement probe 200 or more than one test-and-measurement instrument 101, or both. In such embodiments, the touchscreen user interface 250 may allow the user to select between the various devices (the coupled test-and-measurement probes and test-and-measurement instruments) whose information is to be displayed on the touchscreen user interface 250 or whose operating characteristics are to be set through the touchscreen user interface 250. As noted above, each touchscreen user interface 250, probe head 103, and test-and-measurement instrument 101 may be separately identifiable through the wireless communication protocol.

Figure 3:
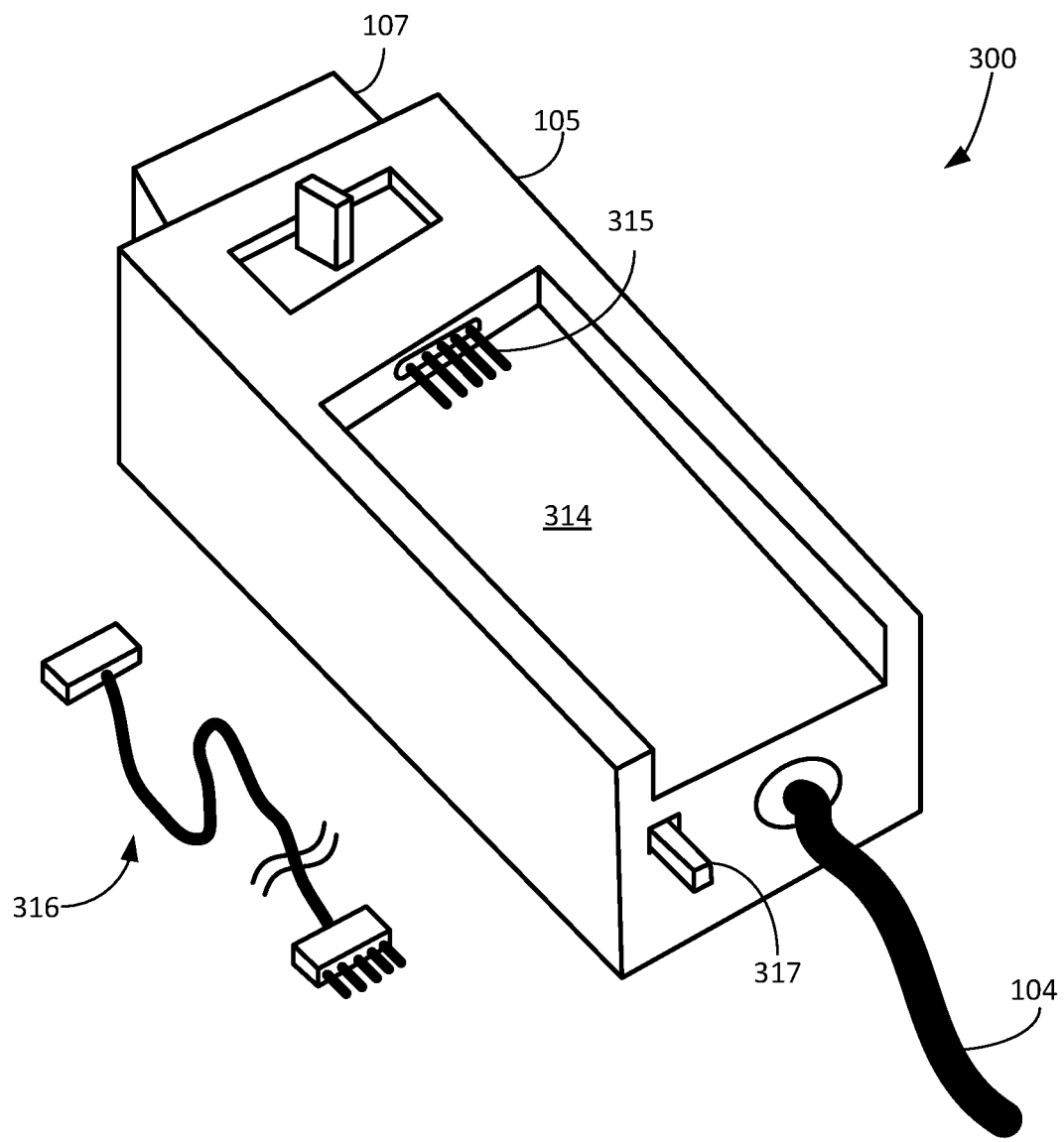
FIG. 3 is a conceptual representation of a test-and-measurement probe configured to accept a removable touchscreen user interface, according to embodiments.

FIG. 3 is a conceptual representation of a portion of a test-and-measurement probe 300, according to embodiments. As illustrated the test-and-measurement probe 300 may include a compbox 105, a probe cable 104 (partially shown), and a probe-to-instrument interface 107. A probe head 103 is not shown in FIG. 3, though it would be at the end of the probe cable 104 that is not attached to the compbox 105. The compbox 105, the probe cable 104, and the probe-to-instrument interface 107 illustrated in FIG. 3 are as described above for FIG. 2, except as noted here.

As illustrated in FIG. 3, the compbox 105 may include a channel 314 configured to accept and secure a touchscreen user interface 250 that is removable from the compbox 105. The compbox 105 may include a connector 315 to provide an electrical connection between the compbox 105 and the touchscreen user interface 250 when the touchscreen user interface 250 is secured within the channel 314. In embodiments, the compbox 105 may include a user-interface cable 316 that is configured to provide a wired electrical connection between the connector 315 of the compbox 105 and the touchscreen user interface 250. The user-interface cable 316 may include a micro USB connector, for example, for connection to the touchscreen user interface 250 or the compbox 105, or both. The compbox 105 may include an eject button 317 configured to, when activated, allow the touchscreen user interface 250 to be removed from the compbox 105.

Figure 4A:
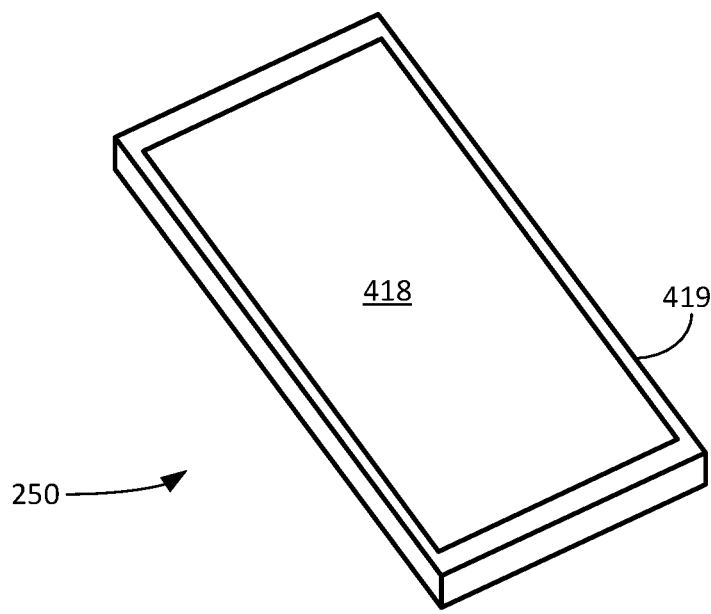
FIG. 4A is a conceptual representation of a front side of a touchscreen user interface, according to embodiments.
Figure 4B:
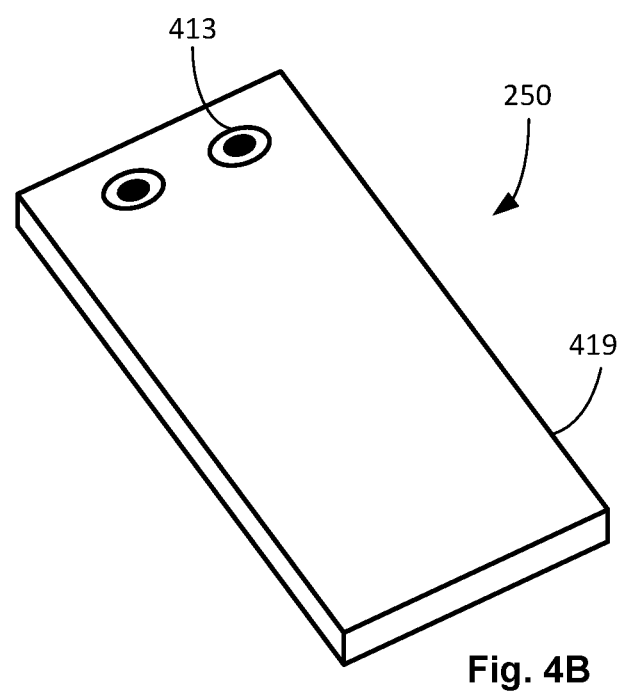
FIG. 4B is a conceptual representation of a back side of the touchscreen user interface of FIG. 4A.

FIG. 4A is a conceptual representation of a front side of a touchscreen user interface 250, according to embodiments. FIG. 4B is a conceptual representation of a back side of the touchscreen user interface 250 of FIG. 4A. As illustrated in FIGS. 4A and 4B, the touchscreen user interface 250 may include a touchscreen display 418 and a housing 419. The housing 419 may be configured to be accepted and secured by the channel 314 of the compbox 105 illustrated in FIG. 3. The touchscreen user interface 250 may be configured to be handheld, having dimensions similar to those of a mobile device. In embodiments, the touchscreen user interface 250 may be a mobile device, such as a smartphone or tablet computer.

The touchscreen user interface 250 may include a camera 413. While illustrated as being on the back side of the touchscreen user interface 250, the camera 413 may be anywhere on the touchscreen user interface 250. The camera 413 may allow the touchscreen user interface 250 to capture live video images of the DUT 102. In some embodiments, a still image may be captured and stored. Those images may then be displayed on the touchscreen display 418 of the touchscreen user interface 250, on a display on the test-and-measurement instrument 101, or both. The displayed image may be a magnification or enlargement of the image captured by the camera 413 to allow the user to better see the probing point of the DUT 102. It may be particularly beneficial if the image is displayed on the touchscreen user interface 250 because the user may then refer to the image to properly position the test-and-measurement probe at the probing point of the DUT 102, without having the look at the test-and-measurement instrument 101. The augmented reality feature, discussed above for the probe camera 213, is likewise a feature of some embodiments having the camera 413 on the touchscreen user interface 250.

Figure 5A:
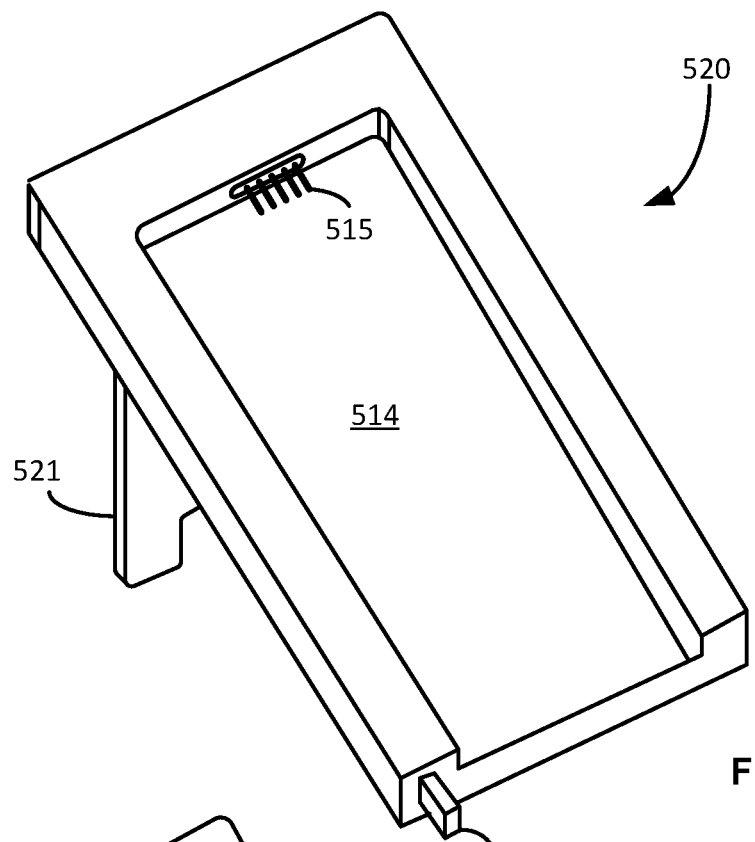
FIG. 5A is a conceptual representation of a front side of a docking station for a touchscreen user interface, according to embodiments.
Figure 5B:
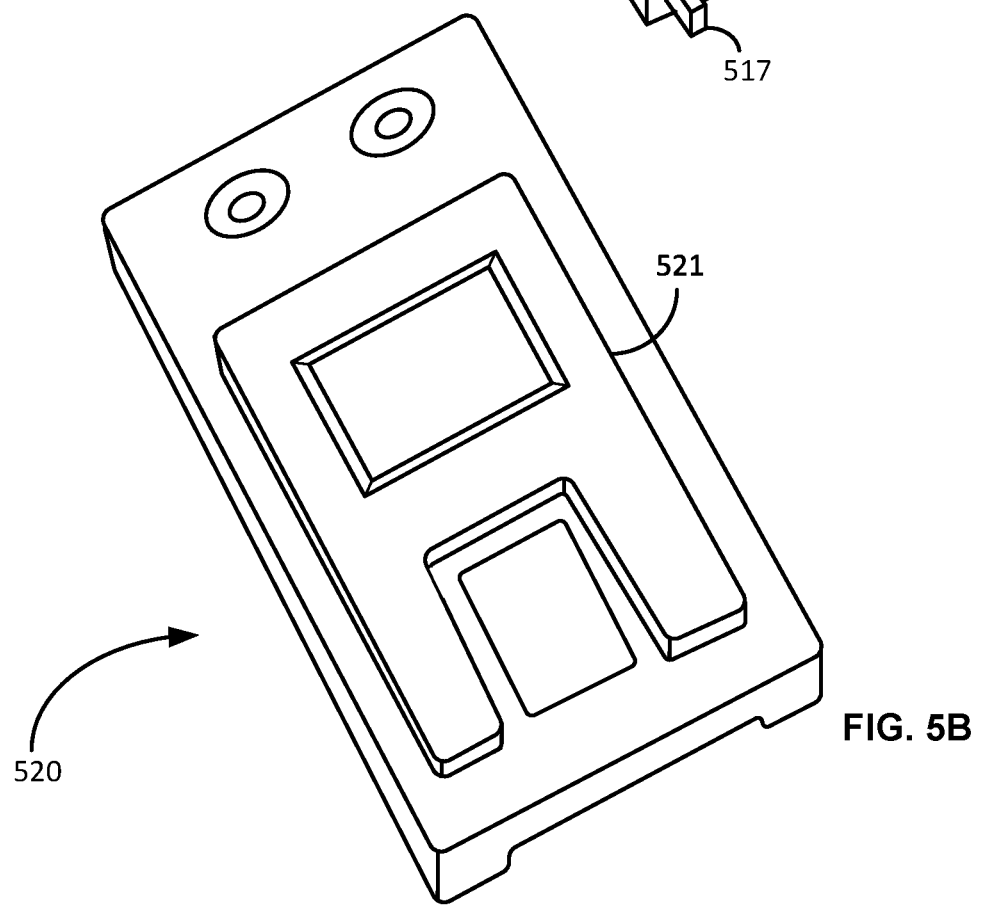
FIG. 5B is a conceptual representation of a back side of the docking station of FIG. 5A.

FIG. 5A is a conceptual representation of a front side of a docking station 520 for a touchscreen user interface 250, according to embodiments. FIG. 5B is a conceptual representation of a back side of the docking station 520 of FIG. 5A. As illustrated in FIGS. 5A and 5B, the docking station 520, or hands-free device holder, may include a channel 514 configured to accept and secure a touchscreen user interface 250, such as the touchscreen user interface 250 illustrated in FIGS. 4A and 4B. The docking station 520 may include a connector 515 to provide an electrical connection between the docking station 520 and the touchscreen user interface 250 when the touchscreen user interface 250 is secured within the channel 514. The docking station 520 may include a stand 521 to support the docking station 520 in an inclined position. In FIG. 5B, the stand 521 is illustrated as being folded against the back side of the docking station 520. The docking station 520 may include an eject button 517 configured to, when activated, allow the touchscreen user interface 250 to be removed from the docking station 520.

In embodiments, the docking station 520 may be wearable by the user, such as, for example, on the user's wrist. The docking station 520 may function as a cover or case to protect the touchscreen user interface 250 when it is not secured to the compbox 105. The docking station 520 may also provide extended battery life for the touchscreen user interface 250 by providing means to recharge the battery of the touchscreen user interface 250 as noted above.

In embodiments, the docking station 520 may include a user-interface cable 316 that is configured to provide a wired electrical connection between the connector 515 of the docking station 520 and the touchscreen user interface 250. The user-interface cable 316 may include, for example, a micro USB connector for connection to the touchscreen user interface 250 or the docking station 520, or both.

Figure 6:
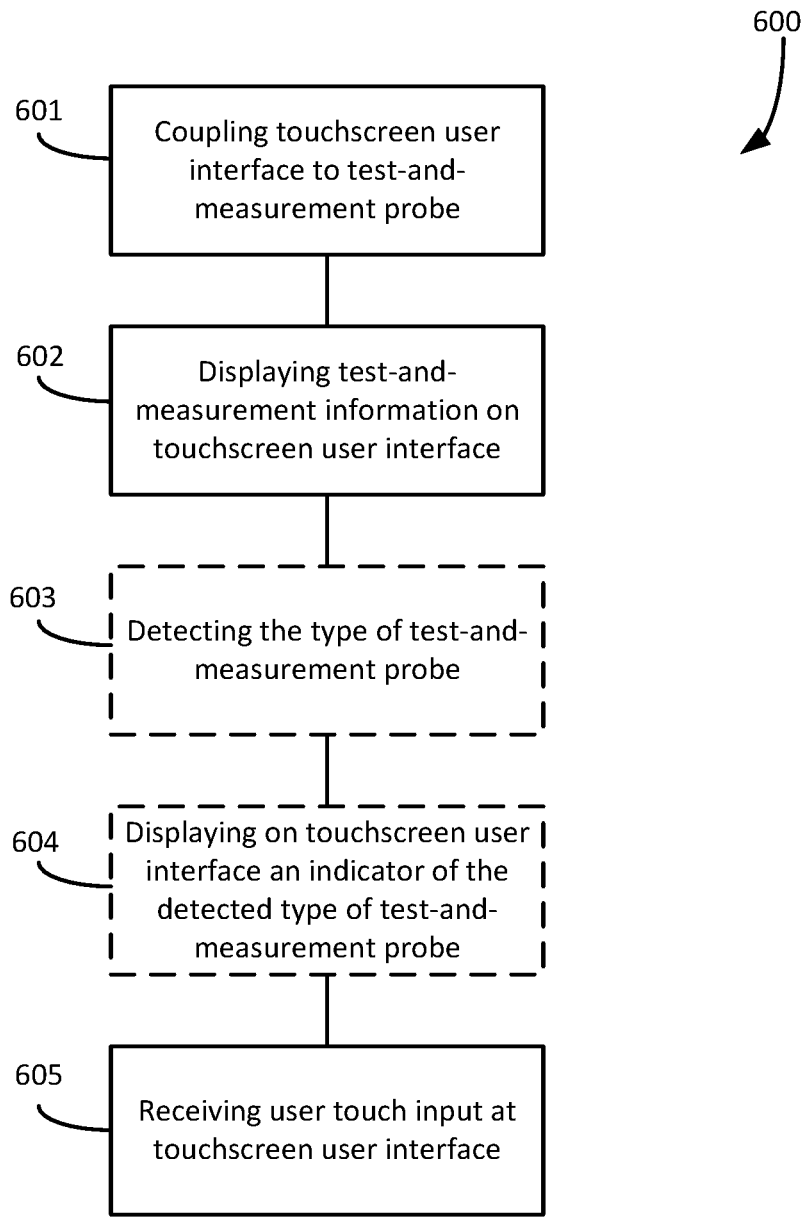
FIG. 6 is a flowchart showing an example method of receiving user input for a test-and-measurement probe, according to embodiments.

As illustrated in FIG. 6, a method 600 of operating a test-and-measurement probe may include coupling 601 a touchscreen user interface to a test-and-measurement probe, the touchscreen user interface configured to visually convey test-and-measurement information to a user and to accept user touch input, and the test-and-measurement probe configured to obtain a signal from a device under test; displaying 602 test-and-measurement information on the touchscreen user interface, the test-and-measurement information including a graphical feature to prompt a user to make a touch input to the touchscreen user interface; and receiving 605 a user touch input at the touchscreen user interface. As described above, the coupling between the touchscreen user interface and the test-and-measurement probe may be wireless.

As described above, the user touch input may include a menu selection, or multiple menu selections, to, for example, view a setting of the test-and-measurement probe, view a setting of a connected test-and-measurement instrument, alter a setting of the test-and-measurement probe, alter a setting of a connected test-and-measurement instrument, view a DUT measurement (such as a current, a voltage, or a waveform), initiate or terminate a function of the test-and-measurement probe, or initiate or terminate a function of a connected test-and-measurement instrument (such as triggering an oscilloscope to capture data).

The method 600 may also include detecting 603 a type of the test-and-measurement probe; and displaying 604, on the touchscreen user interface, an indicator of the detected type of the test-and-measurement probe.

Accordingly, embodiments of the disclosed technology may enhance a user's probing experience by keeping the user's focus on the DUT

EXAMPLES

Illustrative examples of the disclosed technologies are provided below. An embodiment of the technologies may include one or more, and any combination of, the examples described below.

Example 1 includes a test-and-measurement probe for a test-and-measurement instrument, the test-and-measurement probe comprising: a probe head configured to a signal from a device under test; and a touchscreen user interface configured to visually convey test-and-measurement information to a user and to accept user touch input.

Example 2 includes the test-and-measurement probe of Example 1, further comprising a controller, the touchscreen user interface being coupled to the controller.

Example 3 includes the test-and-measurement probe of Example 2, in which the controller is housed in a compbox, and the touchscreen user interface is removably connected to the compbox.

Example 4 includes the test-and-measurement probe of any of Examples 2-3, in which the touchscreen user interface is wirelessly coupled to the controller.

Example 5 includes the test-and-measurement probe of any of Examples 2-3, in which the touchscreen user interface is coupled to the controller by a user-interface cable.

Example 6 includes the test-and-measurement probe of any of Examples 1-5, further comprising a camera, the touchscreen user interface being further configured to display images from the camera.

Example 7 includes the test-and-measurement probe of any of Examples 1-6, in which the touchscreen user interface is wirelessly coupled to the probe head.

Example 8 includes the test-and-measurement probe of any of Examples 1-7, in which the touchscreen user interface comprises a mobile device.

Example 9 includes a test-and-measurement system comprising: a test-and-measurement instrument; and a test-and-measurement probe coupled to the test-and-measurement instrument, the test-and-measurement probe comprising: a probe head configured to obtain a signal from a device under test, and a touchscreen user interface configured to visually convey test-and-measurement information to a user and to accept user touch input.

Example 10 includes the test-and-measurement system of Example 9, in which the touchscreen user interface is configured to wirelessly communicate with the test-and-measurement instrument.

Example 11 includes the test-and-measurement system of any of Examples 9-10, in which the test-and-measurement probe is coupled to the test-and-measurement instrument through a probe-to-instrument interface configured to mechanically and electrically connect the test-and-measurement probe to the test-and-measurement instrument.

Example 12 includes the test-and-measurement system of any of Examples 9-11, further comprising a camera, the test-and-measurement instrument being configured to display images from the camera.

Example 13 includes the test-and-measurement system of any of Examples 9-12, in which the test-and-measurement instrument is an oscilloscope.

Example 14 includes the test-and-measurement system of any of Examples 9-13, the test-and-measurement probe further comprising a controller, in which the touchscreen user interface is coupled to the controller.

Example 15 includes the test-and-measurement system of Example 14, in which the controller is housed in a compbox and the touchscreen user interface is removably connected to the compbox.

Example 16 includes the test-and-measurement system of any of Examples 14-15, in which the touchscreen user interface is wirelessly coupled to the controller.

Example 17 includes the test-and-measurement system of any of Examples 14-15, in which the touchscreen user interface is coupled to the controller by a user-interface cable.

Example 18 includes a method of operating a test-and-measurement probe, the method comprising: coupling a touchscreen user interface to a test-and-measurement probe, the touchscreen user interface configured to visually convey test-and-measurement information to a user and to accept user touch input, and the test-and-measurement probe configured to obtain a signal from a device under test; displaying test-and-measurement information on the touchscreen user interface, the test-and-measurement information including a graphical feature to prompt a user to make a touch input to the touchscreen user interface; and receiving a user touch input at the touchscreen user interface.

Example 19 includes the method of Example 18, in which the coupling the touchscreen user interface to the test-and-measurement probe is wirelessly coupling the touchscreen user interface to the test-and-measurement probe.

Example 20 includes the method of any of Examples 18-19, further comprising: detecting a type of the test-and-measurement probe; and displaying, on the touchscreen user interface, an indicator of the detected type of the test-and-measurement probe.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A test-and-measurement probe for a test-and-measurement instrument having an instrument user interface, the test-and-measurement probe comprising:
   a probe head configured to obtain a signal from a device under test; and
   a touchscreen user interface separate from the probe head but electrically coupled with the probe head configured to visually convey test-and-measurement information to a user and to accept user touch input.

2. The test-and-measurement probe of claim 1, further comprising a controller, the touchscreen user interface being coupled to the controller.

3. The test-and-measurement probe of claim 2, in which the controller is housed in a compbox, and the touchscreen user interface is removably connected to the compbox.

4. The test-and-measurement probe of claim 2, in which the touchscreen user interface is wirelessly coupled to the controller.

5. The test-and-measurement probe of claim 2, in which the touchscreen user interface is coupled to the controller by a user-interface cable.

6. The test-and-measurement probe of claim 1, further comprising a camera, the touchscreen user interface being further configured to display images from the camera.

7. The test-and-measurement probe of claim 1, in which the touchscreen user interface is wirelessly coupled to the probe head.

8. The test-and-measurement probe of claim 1, in which the touchscreen user interface comprises a mobile device.

9. A test-and-measurement system comprising:
   a test-and-measurement instrument having a user interface; and
   a test-and-measurement probe coupled to the test-and-measurement instrument, the test-and-measurement probe comprising:
      a probe head configured to obtain a signal from a device under test, and
      a touchscreen user interface separate from the probe head but electrically coupled with the probe head configured to visually convey test-and-measurement information to a user and to accept user touch input.

10. The test-and-measurement system of claim 9, in which the touchscreen user interface is configured to wirelessly communicate with the test-and-measurement instrument.

11. The test-and-measurement system of claim 9, in which the test-and-measurement probe is coupled to the test-and-measurement instrument through a probe-to-instrument interface configured to mechanically and electrically connect the test-and-measurement probe to the test-and-measurement instrument.

12. The test-and-measurement system of claim 9, further comprising a camera, the test-and-measurement instrument being configured to display images from the camera.

13. The test-and-measurement system of claim 9, in which the test-and-measurement instrument is an oscilloscope.

14. The test-and-measurement system of claim 9, the test-and-measurement probe further comprising a controller, in which the touchscreen user interface is coupled to the controller.

15. The test-and-measurement system of claim 14, in which the controller is housed in a compbox and the touchscreen user interface is removably connected to the compbox.

16. The test-and-measurement system of claim 14, in which the touchscreen user interface is wirelessly coupled to the controller.

17. The test-and-measurement system of claim 14, in which the touchscreen user interface is coupled to the controller by a user-interface cable.

18. A method of operating a test-and-measurement probe, the method comprising:
   coupling a touchscreen user interface to the test-and-measurement probe, the touchscreen user interface configured to visually convey test-and-measurement information to a user and to accept user touch input, and the test-and-measurement probe configured to obtain a signal from a device under test;
   displaying test-and-measurement information on the touchscreen user interface, the test-and-measurement information including a graphical feature to prompt the user to make a touch input to the touchscreen user interface; and
   receiving a user touch input at the touchscreen user interface.

19. The method of claim 18, in which the coupling the touchscreen user interface to the test-and-measurement probe is wirelessly coupling the touchscreen user interface to the test-and-measurement probe.

20. The method of claim 18, further comprising:
   detecting a type of the test-and-measurement probe; and
   displaying, on the touchscreen user interface, an indicator of the detected type of the test-and-measurement probe.

* * * * *